US012805126B2

(12) United States Patent
Kawamura

(10) Patent No.: US 12,805,126 B2
(45) Date of Patent: Nov. 17, 2026

(54) DISPLAY DEVICE INCLUDING A RIB AND PARTITION THAT OVERLAP A CONTACT HOLE AND MANUFACTURING METHOD THEREOF

(71) Applicant: Magnolia White Corporation, Tokyo (JP)

(72) Inventor: Shinichi Kawamura, Tokyo (JP)

(73) Assignee: MAGNOLIA WHITE CORPORATION, Tokyo (JP)

( * ) Notice: Subject to any disclaimer, the term of this patent is extended or adjusted under 35 U.S.C. 154(b) by 352 days.

(21) Appl. No.: 18/498,048

(22) Filed: Oct. 31, 2023

(65) Prior Publication Data

US 2024/0179960 A1 May 30, 2024

(30) Foreign Application Priority Data

Nov. 24, 2022 (JP) ................................ 2022-187255

(51) Int. Cl.

| | |
|---|---|
| ***H10K 59/123*** | (2023.01) |
| ***H10K 59/12*** | (2023.01) |
| ***H10K 59/122*** | (2023.01) |

(52) U.S. Cl.

CPC ....... *H10K 59/123* (2023.02); *H10K 59/1201* (2023.02); *H10K 59/122* (2023.02)

(58) Field of Classification Search

CPC ............ H10K 59/123; H10K 59/1201; H10K 59/122; H10K 50/00; H10K 59/00; H10K 59/124; H10K 59/131; H10D 86/0231; H10D 86/443; H10D 86/60

See application file for complete search history.

(56) References Cited

U.S. PATENT DOCUMENTS

| | | | | |
|---|---|---|---|---|
| 2004/0160170 | A1 | 8/2004 | Sato et al. | |
| 2009/0009069 | A1* | 1/2009 | Takata ................ | H10K 59/122 445/24 |
| 2019/0363275 | A1 | 11/2019 | Ochi et al. | |
| 2022/0077251 | A1 | 3/2022 | Choung et al. | |

FOREIGN PATENT DOCUMENTS

| | | | |
|---|---|---|---|
| JP | 2000-195677 | A | 7/2000 |
| JP | 2004-207217 | A | 7/2004 |
| JP | 2008-135325 | A | 6/2008 |
| JP | 2009-032673 | A | 2/2009 |
| JP | 2010-118191 | A | 5/2010 |
| WO | 2018/179308 | A1 | 10/2018 |

* cited by examiner

*Primary Examiner* — Anne M Hines
*Assistant Examiner* — Jose M Diaz
(74) *Attorney, Agent, or Firm* — XSENSUS LLP

(57) ABSTRACT

According to one embodiment, a display device includes a circuit layer, an insulating layer comprising a contact hole, a lower electrode provided above the insulating layer and connected to the pixel circuit through the contact hole, a filling material inside the contact hole, a rib including a pixel aperture, a partition above the rib, an organic layer covering the lower electrode, and an upper electrode covering the organic layer. The rib and the partition overlap an entire of the contact hole as seen in plan view. A thickness of the filling material is less than a depth of the contact hole.

20 Claims, 15 Drawing Sheets

DISPLAY DEVICE INCLUDING A RIB AND PARTITION THAT OVERLAP A CONTACT HOLE AND MANUFACTURING METHOD THEREOF

CROSS-REFERENCE TO RELATED APPLICATIONS

This application is based upon and claims the benefit of priority from Japanese Patent Application No. 2022-187255, filed Nov. 24, 2022, the entire contents of which are incorporated herein by reference.

FIELD

Embodiments described herein relate generally to a display device and a manufacturing method thereof.

BACKGROUND

Recently, display devices to which an organic light emitting diode (OLED) is applied as a display element have been put into practical use. This display element comprises a lower electrode, an organic layer which covers the lower electrode, and an upper electrode which covers the organic layer. The lower electrode is provided on, for example, an insulating layer formed of an organic insulating material, and is connected to a pixel circuit including a thin-film transistor through a contact hole provided in the insulating layer.

When such a display device is manufactured, a technique which improves the yield of the manufacturing process is required.

DETAILED DESCRIPTION

Figure 1:
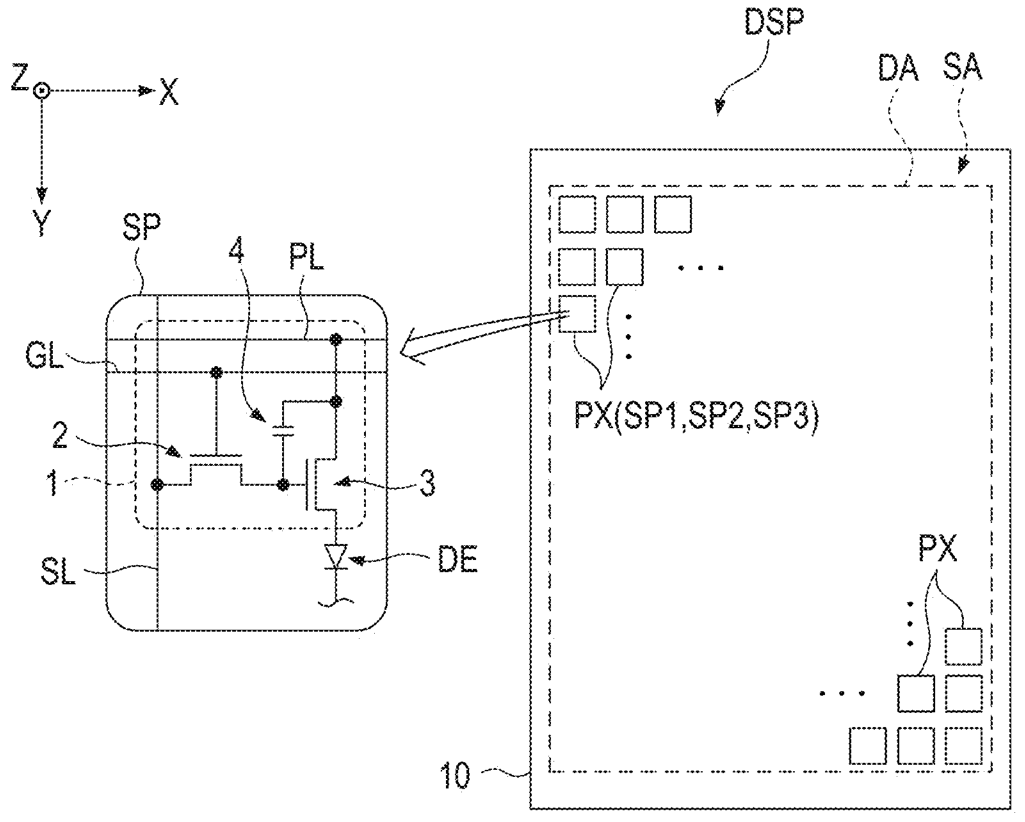
FIG. 1 is a diagram showing a configuration example of a display device according to an embodiment.

In general, according to one embodiment, a display device comprises a circuit layer including a pixel circuit, an insulating layer which covers the circuit layer and comprises a contact hole, a lower electrode provided above the insulating layer and connected to the pixel circuit through the contact hole, a filling material located inside the contact hole and formed of an organic insulating material which covers the lower electrode, a rib comprising a pixel aperture which overlaps the lower electrode, a partition provided above the rib, an organic layer which covers the lower electrode through the pixel aperture and emits light based on application of voltage, and an upper electrode which covers the organic layer. The rib and the partition overlap an entire of the contact hole as seen in plan view. A thickness of the filling material is less than a depth of the contact hole.

According to another embodiment, a manufacturing method of a display device comprises forming a circuit layer including a pixel circuit, forming an insulating layer which covers the circuit layer and comprises a contact hole, forming a lower electrode connected to the pixel circuit through the contact hole above the insulating layer, forming an insulating photosensitive material which covers the insulating layer and the lower electrode and fills at least part of the contact hole, exposing an entire of the photosensitive material without using a photomask, and forming a filling material having a thickness less than a depth of the contact hole inside the contact hole by developing the photosensitive material to remove a portion of the photosensitive material located outside the contact hole, and by reducing a thickness of a portion of the photosensitive material located inside the contact hole.

The embodiments can provide a display device in which the yield of a manufacturing process can be improved and a manufacturing method thereof.

Embodiments will be described with reference to the accompanying drawings.

The disclosure is merely an example, and proper changes in keeping with the spirit of the invention, which are easily conceivable by a person of ordinary skill in the art, come within the scope of the invention as a matter of course. In addition, in some cases, in order to make the description clearer, the widths, thicknesses, shapes, etc., of the respective parts are illustrated schematically in the drawings, rather than as an accurate representation of what is implemented. However, such schematic illustration is merely exemplary, and in no way restricts the interpretation of the invention. In addition, in the specification and drawings, structural elements which function in the same or a similar manner to those described in connection with preceding drawings are denoted by like reference numbers, detailed description thereof being omitted unless necessary.

In the drawings, in order to facilitate understanding, an X-axis, a Y-axis and a Z-axis orthogonal to each other are shown depending on the need. A direction parallel to the X-axis is referred to as a first direction X. A direction parallel to the Y-axis is referred to as a second direction Y. A direction parallel to the Z-axis is referred to as a third direction Z. The third direction Z is a normal direction relative to a plane including the first direction X and the second direction Y. When various elements are viewed parallel to the third direction Z, the appearance is defined as a plan view.

The display device of each embodiment is an organic electroluminescent display device comprising an organic light emitting diode (OLED) as a display element, and could be mounted on various types of electronic devices such as a television, a personal computer, a vehicle-mounted device, a tablet, a smartphone, a mobile phone and a wearable terminal.

FIG. 1 is a diagram showing a configuration example of a display device DSP according to an embodiment. The display device DSP comprises a display area DA which displays an image and a surrounding area SA around the display area DA on an insulating substrate 10. The substrate 10 may be glass or a resinous film having flexibility.

In the present embodiment, the substrate 10 is rectangular as seen in plan view. It should be noted that the shape of the substrate 10 in plan view is not limited to a rectangular shape and may be another shape such as a square shape, a circular shape or an elliptic shape.

The display area DA comprises a plurality of pixels PX arrayed in matrix in a first direction X and a second direction Y. Each pixel PX includes a plurality of subpixels SP. For example, each pixel PX includes a blue subpixel SP1, a green subpixel SP2 and a red subpixel SP3. Each pixel PX may include a subpixel SP which exhibits another color such as white in addition to subpixels SP1, SP2 and SP3 or instead of one of subpixels SP1, SP2 and SP3.

Each subpixel SP comprises a pixel circuit 1 and a display element DE driven by the pixel circuit 1. The pixel circuit 1 comprises a pixel switch 2, a drive transistor 3 and a capacitor 4. The pixel switch 2 and the drive transistor 3 are, for example, switching elements consisting of thin-film transistors.

The gate electrode of the pixel switch 2 is connected to a scanning line GL. One of the source electrode and drain electrode of the pixel switch 2 is connected to a signal line SL. The other one is connected to the gate electrode of the drive transistor 3 and the capacitor 4. In the drive transistor 3, one of the source electrode and the drain electrode is connected to a power line PL and the capacitor 4, and the other one is connected to the display element DE.

It should be noted that the configuration of the pixel circuit 1 is not limited to the example shown in the figure. For example, the pixel circuit 1 may comprise more thin-film transistors and capacitors.

Figure 2:
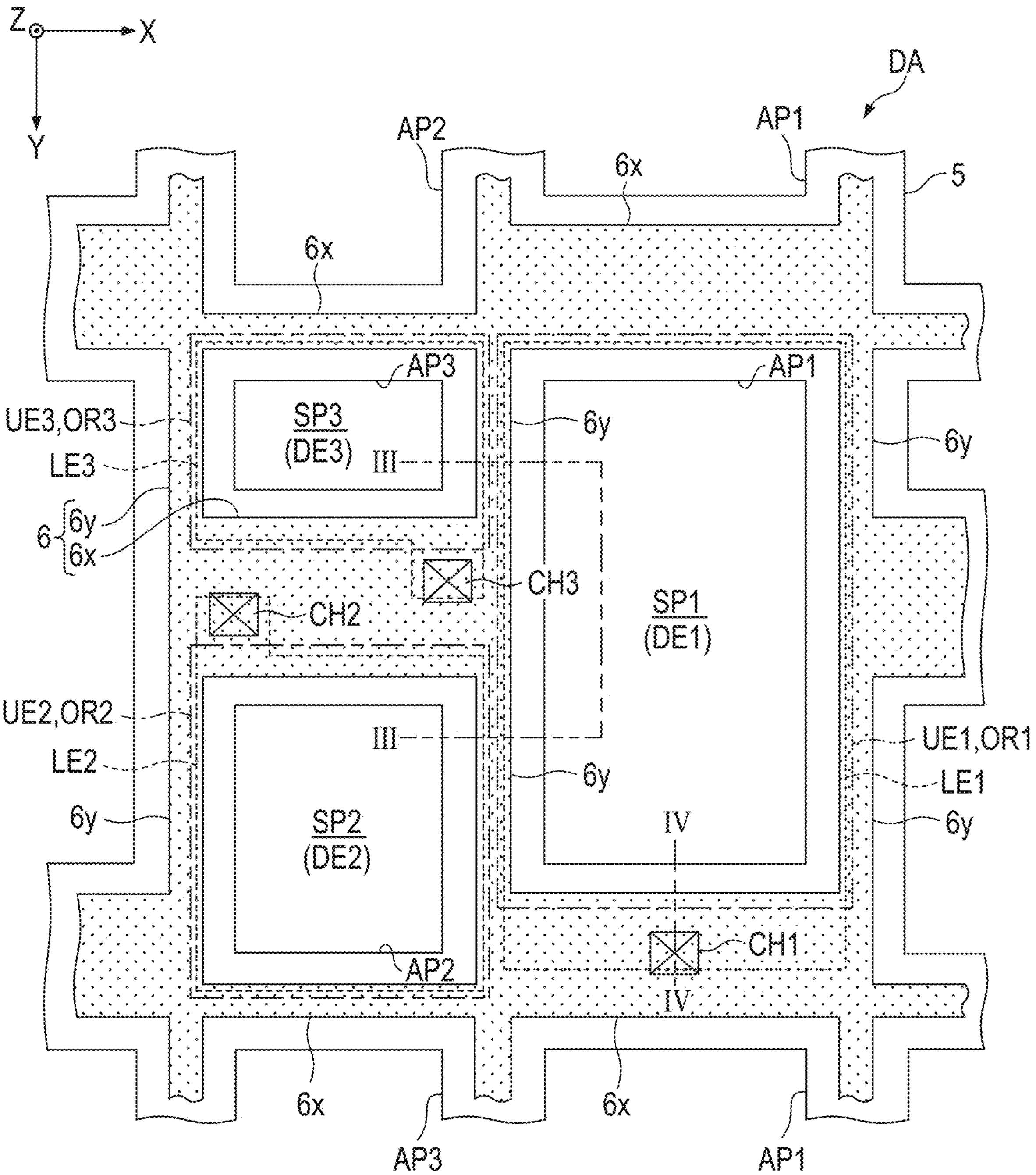
FIG. 2 is a schematic plan view showing an example of the layout of subpixels.

FIG. 2 is a schematic plan view showing an example of the layout of subpixels SP1, SP2 and SP3. In the example of FIG. 2, each of subpixels SP2 and SP3 is adjacent to subpixel SP1 in the first direction X. Further, subpixels SP2 and SP3 are arranged in the second direction Y.

When subpixels SP1, SP2 and SP3 are provided in line with this layout, in the display area DA, a column in which subpixels SP2 and SP3 are alternately provided in the second direction Y and a column in which a plurality of subpixels SP1 are repeatedly provided in the second direction Y are formed. These columns are alternately arranged in the first direction X. It should be noted that the layout of subpixels SP1, SP2 and SP3 is not limited to the example of FIG. 2.

A rib 5 and a partition 6 are provided in the display area DA. The rib 5 comprises pixel apertures AP1, AP2 and AP3 in subpixels SP1, SP2 and SP3, respectively. In the example of FIG. 2, the pixel aperture AP1 is larger than the pixel aperture AP2. The pixel aperture AP2 is larger than the pixel aperture AP3.

The partition 6 is provided in the boundary between adjacent subpixels SP and overlaps the rib 5 as seen in plan view. The partition 6 comprises a plurality of first partitions 6*x* extending in the first direction X and a plurality of second partitions 6*y* extending in the second direction Y. The first partitions 6*x* are provided between two pixel apertures AP1 which are adjacent to each other in the second direction Y and between the pixel apertures AP2 and AP3 which are adjacent to each other in the second diction Y. Each second partition 6*y* is provided between the pixel apertures AP1 and AP2 which are adjacent to each other in the first direction X and between the pixel apertures AP1 and AP3 which are adjacent to each other in the first direction X.

In the example of FIG. 2, the first partitions 6*x* and the second partitions 6*y* are connected to each other. In this configuration, the partition 6 has a grating shape surrounding the pixel apertures AP1, AP2 and AP3 as a whole. In other words, the partition 6 comprises apertures in subpixels SP1, SP2 and SP3 in a manner similar to that of the rib 5.

Subpixel SP1 comprises a lower electrode LE1, an upper electrode UE1 and an organic layer OR1 overlapping the pixel aperture AP1. Subpixel SP2 comprises a lower electrode LE2, an upper electrode UE2 and an organic layer OR2 overlapping the pixel aperture AP2. Subpixel SP3 comprises a lower electrode LE3, an upper electrode UE3 and an organic layer OR3 overlapping the pixel aperture AP3.

Of the lower electrode LE1, the upper electrode UE1 and the organic layer OR1, the portions which overlap the pixel aperture AP1 constitute the display element DE1 of subpixel SP1. Of the lower electrode LE2, the upper electrode UE2 and the organic layer OR2, the portions which overlap the pixel aperture AP2 constitute the display element DE2 of subpixel SP2. Of the lower electrode LE3, the upper electrode UE3 and the organic layer OR3, the portions which overlap the pixel aperture AP3 constitute the display element DE3 of subpixel SP3. Each of the display elements DE1, DE2 and DE3 may further include a cap layer as described later. The rib 5 and the partition 6 surround each of these display elements DE1, DE2 and DE3.

The lower electrode LE1 is connected to the pixel circuit 1 (see FIG. 1) of subpixel SP1 through a contact hole CH1. The lower electrode LE2 is connected to the pixel circuit 1 of subpixel SP2 through a contact hole CH2. The lower electrode LE3 is connected to the pixel circuit 1 of subpixel SP3 through a contact hole CH3.

In the example of FIG. 2, the contact holes CH1, CH2 and CH3 overlap the rib 5 and the partition 6 as a whole. Specifically, the contact hole CH1 entirely overlaps the first partition 6*x* between two pixel apertures AP1 which are adjacent to each other in the second direction Y. The contact holes CH2 and CH3 entirely overlap the first partition 6*x* between the pixel apertures AP2 and AP3 which are adjacent to each other in the second direction Y.

As another example, at least one of the contact holes CH1, CH2 and CH3 may overlap the second partition 6*y*. In this case, the widths of the second partition 6*y* and the rib 5 located under the second partition 6*y* may be increased at positions overlapping the contact holes CH1, CH2 and CH3.

Figure 3:
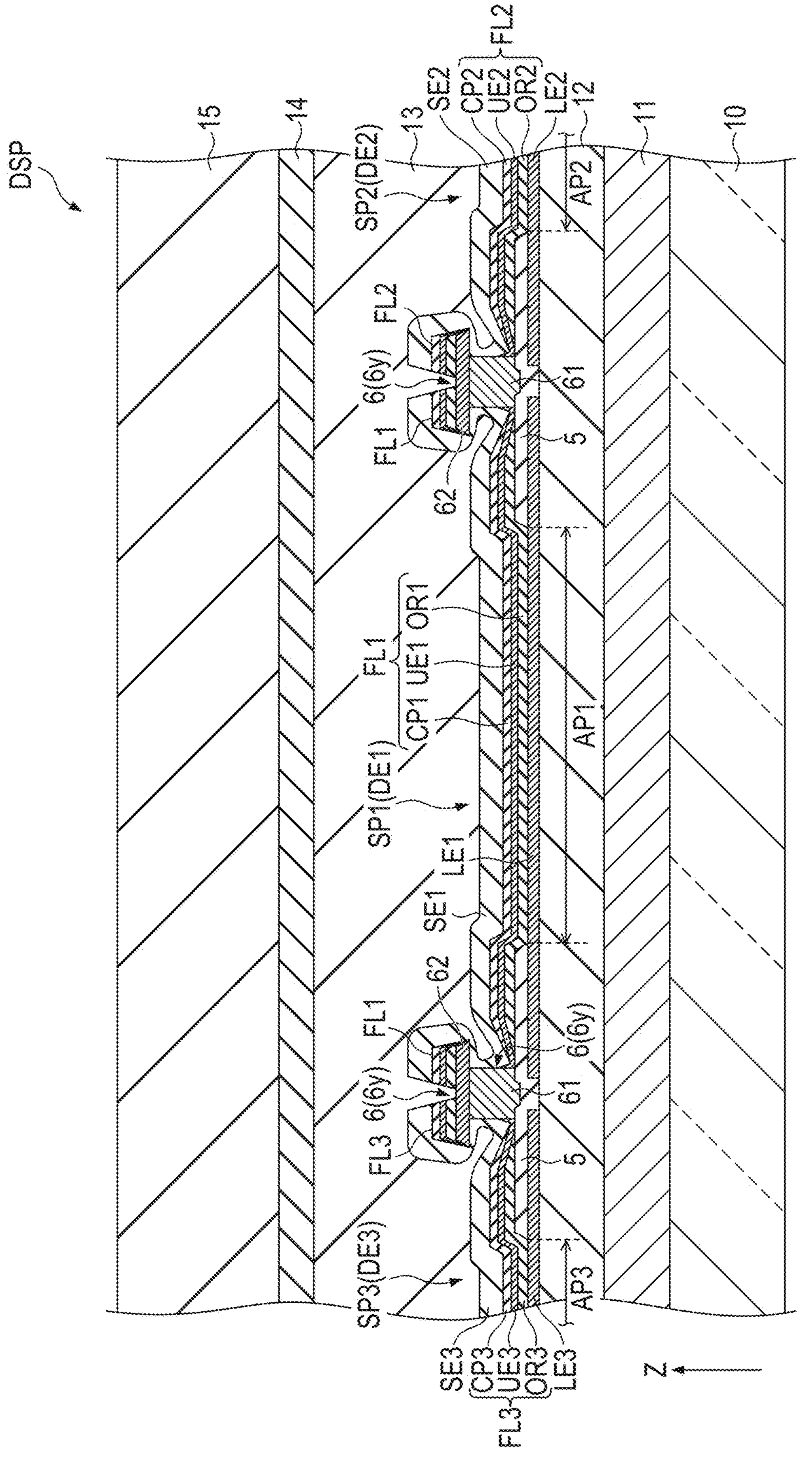
FIG. 3 is a schematic cross-sectional view of the display device along the III-III line of FIG. 2.

FIG. 3 is a schematic cross-sectional view of the display device DSP along the III-III line of FIG. 2. A circuit layer 11 is provided on the substrate 10 described above. The circuit layer 11 includes various circuits and lines such as the pixel circuit 1, scanning line GL, signal line SL and power line PL shown in FIG. 1.

The circuit layer 11 is covered with an insulating layer 12. The insulating layer 12 functions as a planarization film which planarizes the irregularities formed by the circuit layer 11. Although not shown in the section of FIG. 3, the contact holes CH1, CH2 and CH3 described above are provided in the insulating layer 12.

The lower electrodes LE1, LE2 and LE3 are provided on the insulating layer 12. The rib 5 is provided on the insulating layer 12 and the lower electrodes LE1, LE2 and LE3. The end portions of the lower electrodes LE1, LE2 and LE3 are covered with the rib 5.

The partition 6 includes a conductive lower portion 61 provided on the rib 5 and an upper portion 62 provided on the lower portion 61. The upper portion 62 has a width greater than that of the lower portion 61. By this configuration, in FIG. 3, the both end portions of the upper portion 62 protrude relative to the side surfaces of the lower portion 61. This shape of the partition 6 is called an overhang shape.

The organic layer OR1 covers the lower electrode LE1 through the pixel aperture AP1. The upper electrode UE1 covers the organic layer OR1 and faces the lower electrode LE1. The organic layer OR2 covers the lower electrode LE2 through the pixel aperture AP2. The upper electrode UE2 covers the organic layer OR2 and faces the lower electrode LE2. The organic layer OR3 covers the lower electrode LE3 through the pixel aperture AP3. The upper electrode UE3 covers the organic layer OR3 and faces the lower electrode LE3.

In the example of FIG. 3, a cap layer CP1 is provided on the upper electrode UE1. A cap layer CP2 is provided on the upper electrode UE2. A cap layer CP3 is provided on the upper electrode UE3. The cap layers CP1, CP2 and CP3 function as optical adjustment layers which improve the extraction efficiency of the light emitted from the organic layers OR1, OR2 and OR3, respectively.

In the following explanation, a stacked layer body including the organic layer OR1, the upper electrode UE1 and the cap layer CP1 is called a thin film FL1. A stacked layer body including the organic layer OR2, the upper electrode UE2 and the cap layer CP2 is called a thin film FL2. A stacked layer body including the organic layer OR3, the upper electrode UE3 and the cap layer CP3 is called a thin film FL3.

The thin film FL1 is partly located on the upper portion 62. This portion is spaced apart from, of the thin film FL1, the portion located under the partition 6 (in other words, the portion which constitutes the display element DE1). Similarly, the thin film FL2 is partly located on the upper portion 62. This portion is spaced apart from, of the thin film FL2, the portion located under the partition 6 (in other words, the portion which constitutes the display element DE2). Further, the thin film FL3 is partly located on the upper portion 62. This portion is spaced apart from, of the thin film FL3, the portion located under the partition 6 (in other words, the portion which constitutes the display element DE3).

Sealing layers SE1, SE2 and SE3 are provided in subpixels SP1, SP2 and SP3, respectively. The sealing layer SE1 continuously covers the thin film FL1 and the partition 6 around subpixel SP1. The sealing layer SE2 continuously covers the thin film FL2 and the partition 6 around subpixel SP2. The sealing layer SE3 continuously covers the thin film FL3 and the partition 6 around subpixel SP3.

In the example of FIG. 3, the thin film FL1 and sealing layer SE1 located on the partition 6 between subpixels SP1 and SP2 are spaced apart from the thin film FL2 and sealing layer SE2 located on this partition 6. The thin film FL1 and sealing layer SE1 located on the partition 6 between subpixels SP1 and SP3 are spaced apart from the thin film FL3 and sealing layer SE3 located on this partition 6.

The sealing layers SE1, SE2 and SE3 are covered with a resin layer 13. The resin layer 13 is covered with a sealing layer 14. The sealing layer 14 is covered with a resin layer 15. The resin layers 13 and 15 and the sealing layer 14 are continuously provided in at least the entire display area DA and partly extend in the surrounding area SA as well.

A cover member such as a polarizer, a touch panel, a protective film or a cover glass may be further provided above the resin layer 15. This cover member may be attached to the resin layer 15 via, for example, an adhesive layer such as an optical clear adhesive (OCA).

The insulating layer 12 is formed of an organic insulating material. Each of the rib 5 and the sealing layers 14, SE1, SE2 and SE3 is formed of, for example, an inorganic insulating material such as silicon nitride (SiNx). Each of the rib 5 and the sealing layers 14, SE1, SE2 and SE3 may be formed of a single-layer body of one of silicon oxide (SiOx), silicon oxynitride (SiON) and aluminum oxide ($Al_2O_3$). Each of the rib 5 and the sealing layers 14, SE1, SE2 and SE3 may be formed of a stacked layer body of a combination consisting of at least two of a silicon nitride layer, a silicon oxide layer, a silicon oxynitride layer and an aluminum oxide layer. Each of the resin layers 13 and 15 is formed of, for example, a resinous material (organic insulating material) such as epoxy resin or acrylic resin.

Each of the lower electrodes LE1, LE2 and LE3 comprises a reflective layer formed of, for example, silver (Ag), and a pair of conductive oxide layers covering the upper and lower surfaces of the reflective layer. Each conductive oxide layer may be formed of, for example, a transparent conductive oxide such as indium tin oxide (ITO), indium zinc oxide (IZO) or indium gallium zinc oxide (IGZO).

Each of the upper electrodes UE1, UE2 and UE3 is formed of, for example, a metal material such as an alloy of magnesium and silver (MgAg). For example, the lower electrodes LE1, LE2 and LE3 correspond to anodes, and the upper electrodes UE1, UE2 and UE3 correspond to cathodes.

For example, each of the organic layers OR1, OR2 and OR3 comprises a multilayer structure consisting of a hole injection layer, a hole transport layer, an electron blocking layer, a light emitting layer, a hole blocking layer, an electron transport layer and an electron injection layer. Each of the organic layers OR1, OR2 and OR3 may comprise a tandem structure including a plurality of light emitting layers.

Each of the cap layers CP1, CP2 and CP3 is formed of, for example, a multilayer body of a plurality of transparent thin films. As the thin films, the multilayer body may include a thin film formed of an inorganic material and a thin film formed of an organic material. These thin films have refractive indices different from each other. The materials of the thin films constituting the multilayer body are different from the materials of the upper electrodes UE1, UE2 and UE3 and are also different from the materials of the sealing layers SE1, SE2 and SE3. It should be noted that the cap layers CP1, CP2 and CP3 may be omitted.

The lower portion 61 of the partition 6 is formed of, for example, aluminum. The lower portion 61 may be formed of an aluminum alloy such as an aluminum-neodymium alloy (AlNd) or may comprise a multilayer structure consisting of an aluminum layer and an aluminum alloy layer. Further, the lower portion 61 may comprise a bottom layer formed of a metal material different from aluminum and an aluminum alloy under the aluminum layer or the aluminum alloy layer.

This bottom layer can be formed of, for example, molybdenum (Mo), titanium nitride (TiN), a molybdenum-tungsten alloy (MoW) or a molybdenum-niobium alloy (MoNb). The bottom layer may comprise a double-layered structure in which the lower layer is formed of ITO or IZO and the upper layer is formed of the above metal materials.

For example, the upper portion 62 of the partition 6 comprises a multilayer structure consisting of a lower layer formed of a metal material such as titanium and an upper layer formed of conductive oxide such as ITO. The upper portion 62 may comprise a single-layer structure of a metal material such as titanium. The upper portion 62 may comprise a single-layer structure of an inorganic insulating material different from the sealing layers SE1, SE2 and SE3.

Common voltage is applied to the partition 6. This common voltage is applied to each of the upper electrodes UE1, UE2 and UE3 which are in contact with the side surfaces of the lower portions 61. Pixel voltage is applied to the lower electrodes LE1, LE2 and LE3 through the pixel circuits 1 provided in subpixels SP1, SP2 and SP3, respectively.

The organic layers OR1, OR2 and OR3 emit light based on the application of voltage. Specifically, when a potential difference is formed between the lower electrode LE1 and the upper electrode UE1, the light emitting layer of the organic layer OR1 emits light in a blue wavelength range. When a potential difference is formed between the lower electrode LE2 and the upper electrode UE2, the light emitting layer of the organic layer OR2 emits light in a green wavelength range. When a potential difference is formed between the lower electrode LE3 and the upper electrode UE3, the light emitting layer of the organic layer OR3 emits light in a red wavelength range.

As another example, the light emitting layers of the organic layers OR1, OR2 and OR3 may emit light exhibiting the same color (for example, white). In this case, the display device DSP may comprise color filters which convert the light emitted from the light emitting layers into light exhibiting colors corresponding to subpixels SP1, SP2 and SP3. The display device DSP may comprise a layer including quantum dots which generate light exhibiting colors corresponding to subpixels SP1, SP2 and SP3 by the excitation caused by the light emitted from the light emitting layers.

Figure 4:
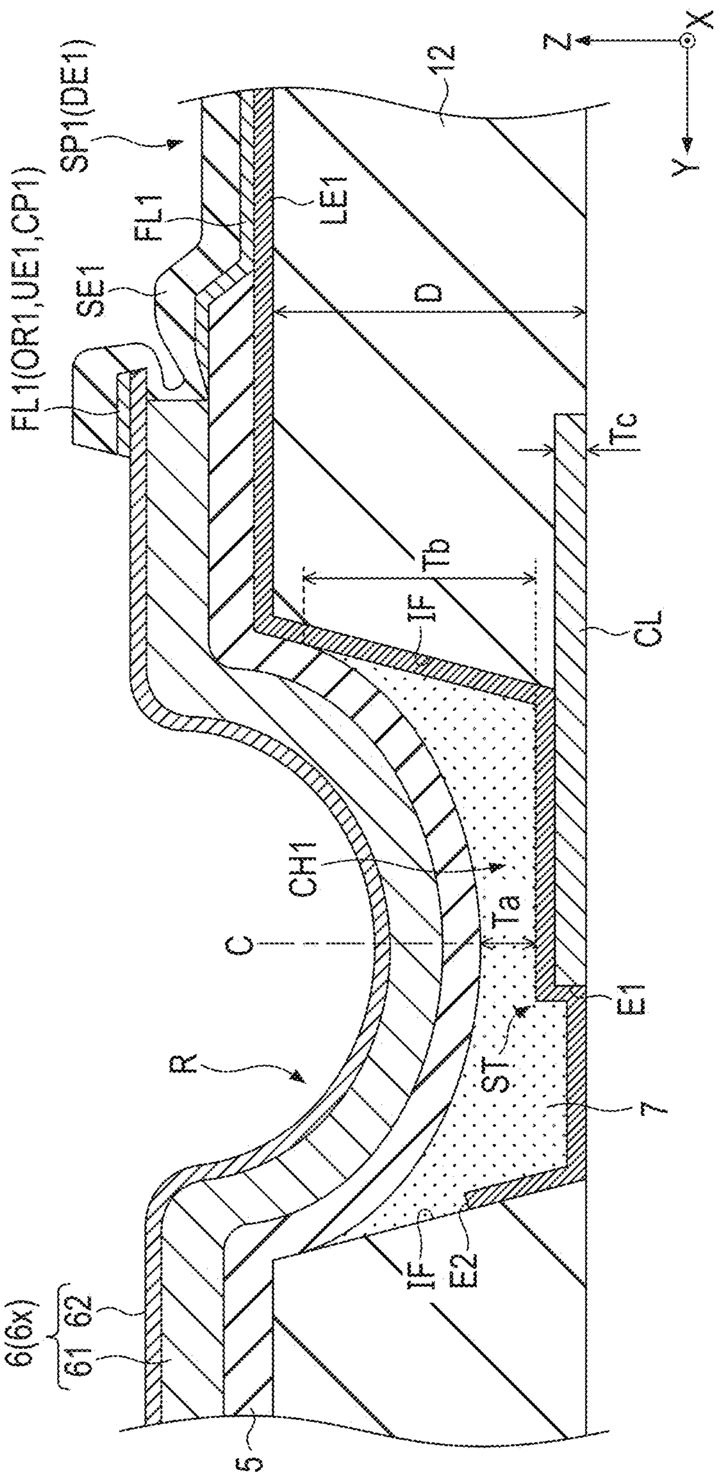
FIG. 4 is a schematic cross-sectional view of the display device along the IV-IV line of FIG. 2.

FIG. 4 is a schematic cross-sectional view of the display device DSP along the IV-IV line of FIG. 2. In FIG. 4, the substrate 10, the circuit layer 11, the resin layers 13 and 15 and the sealing layer 14 are omitted.

The pixel circuit 1 shown in FIG. 1 comprises a conductive layer CL. The conductive layer CL corresponds to, for example, the source electrode or drain electrode of the driver transistor 3 shown in FIG. 1. The conductive layer CL is formed of, for example, a metal material, and is covered with the insulating layer 12.

The conductive layer CL is partly exposed from the insulating layer 12 through the contact hole CH1. In the example of FIG. 4, an end portion E1 of the conductive layer CL is located inside the contact hole CH1.

The lower electrode LE1 is partly located inside the contact hole CH1 and is partly in contact with the conductive layer CL. In the example of FIG. 4, an end portion E2 of the lower electrode LE1 is located inside the contact hole CH1. More specifically, the end portion E2 is located on the inner surface IF of the contact hole CH1. However, the position of the end portion E2 is not limited to this example. For example, the end portion E2 may be located outside the contact hole CH1.

The lower electrode LE1 covers the end portion E1 of the conductive layer CL. By this configuration, a step portion ST corresponding to the end portion E1 is formed in the lower electrode LE1. In the example of FIG. 4, the position of the end portion E1 is not coincident with the center C of the contact hole CH1. Thus, the position of the step portion ST is not coincident with the center C.

In the embodiment, a filling material 7 is provided inside the contact hole CH1. The filling material 7 is formed of, for example, an organic insulating material such as polyimide. The filling material 7 covers a large part of the lower electrode LE1 located inside the contact hole CH1. In other words, the filling material 7 covers the step portion ST. In the example of FIG. 4, the filling material 7 covers the end portion E2 as well. However, the configuration is not limited to this example.

The rib 5 entirely covers the filling material 7. The partition 6 is provided on the rib 5. Each of the rib 5 and the partition 6 comprises a recess portion R which is depressed toward the inside of the contact hole CH1.

The thin film FL1 (the organic layer OR1, the upper electrode UE1 and the cap layer CP1) covers, of the lower electrode LE1, the portion exposed from the rib 5, and is also located on the upper portion 62 of the partition 6. The sealing layer SE1 continuously covers the thin film FL1. In the example of FIG. 4, neither the thin film FL1 nor the sealing layer SE1 is provided above the contact hole CH1. As another example, the thin film FL1 and the sealing layer SE1 may be provided in part of or the entire part of the upper side of the contact hole CH1.

The filling material 7 has thickness Ta in the center C of the contact hole CH1 and has thickness Tb near the inner surface IF of the contact hole CH1. Thickness Ta corresponds to the distance from the upper surface of the lower electrode LE1 in the center C to the upper surface of the filling material 7. Thickness Tb corresponds to the distance from the upper surface of the lower electrode LE1 located inside the contact hole CH1 to the upper end of the filling material 7 located near the inner surface IF.

In the example of FIG. 4, thickness Ta is less than thickness Tb ($Ta<Tb$). Thus, the filling material 7 has a shape in which the thickness decreases toward the center C of the contact hole CH1. From another viewpoint, the upper surface of the filling material 7 has a shape which is depressed toward the lower side so as to be the lowest near the center C.

The thickness of the filling material 7 is less than depth D of the contact hole CH1 (the thickness of the insulating layer 12) as a whole. Thus, both thickness Ta and thickness Tb are less than depth D ($Ta, Tb<D$). Depth D is, for example, greater than or equal to 1 μm, and is greater than the thicknesses of the rib 5 and the partition 6.

The thickness of, of the filling material 7, the portion located above the end portion E1 should be preferably greater than or equal to thickness Tc of the conductive layer CL. By this configuration, the effect of the step portion ST does not easily emerge on the surface of the filling material 7. Thus, the shapes of the rib 5 and the partition 6 inside the contact hole CH1 are stabilized.

It should be noted that the structures of the contact holes CH2 and CH3 and their vicinities are similar to the structure of the contact hole CH1 and its vicinity shown in the example of FIG. 4. Specifically, filling materials 7 whose thicknesses are less than the depths of the contact holes CH2 and CH3 are provided inside the contact holes CH2 and CH3, respectively. The lower electrodes LE2 and LE3 are covered with the filling materials 7.

Now, this specification explains the manufacturing method of the display device DSP.

Figure 5:
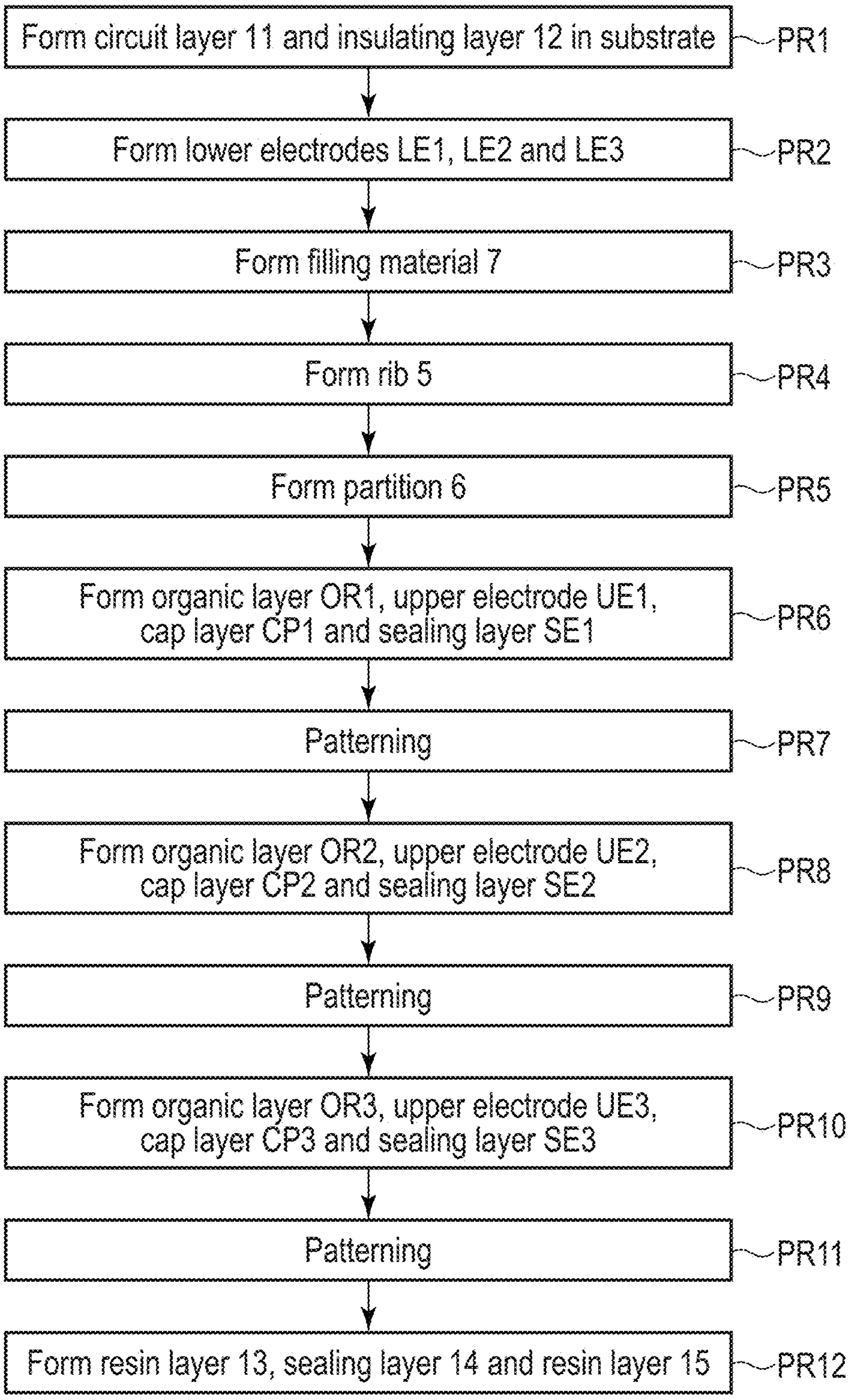
FIG. 5 is a flowchart showing an example of the manufacturing method of the display device.

FIG. 5 is a flowchart showing an example of the manufacturing method of the display device DSP. Each of FIG. 6 to FIG. 17 is a schematic cross-sectional view showing part of the manufacturing process of the display device DSP. In FIG. 6 to FIG. 17, the substrate 10, the circuit layer 11 and the like are omitted.

To manufacture the display device DSP, first, the circuit layer 11 and the insulating layer 12 are formed on the substrate 10 (process PR1). In this process, the conductive layer CL and contact holes CH1, CH2 and CH3 described above are also formed.

After process PR1, the lower electrodes LE1, LE2 and LE3 are formed on the insulating layer 12 (process PR2). Moreover, the filling material 7 is formed inside each of the contact holes CH1, CH2 and CH3 (process PR3).

Figure 6:
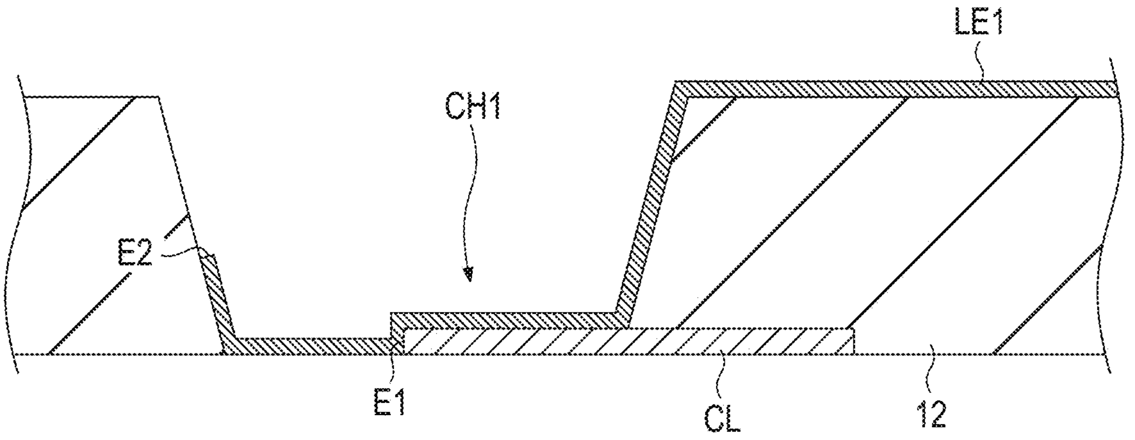
FIG. 6 is a schematic cross-sectional view showing part of the manufacturing process of the display device.

Now, this specification explains an example of process PR3 with reference to FIG. 6 to FIG. 9. These drawings show the contact hole CH1 and its vicinity. FIG. 6 shows a state before the filling material 7 is formed. In FIG. 6, the lower electrode LE1 is formed on the insulating layer 12 and is partly located inside the contact hole CH1.

Figure 7:
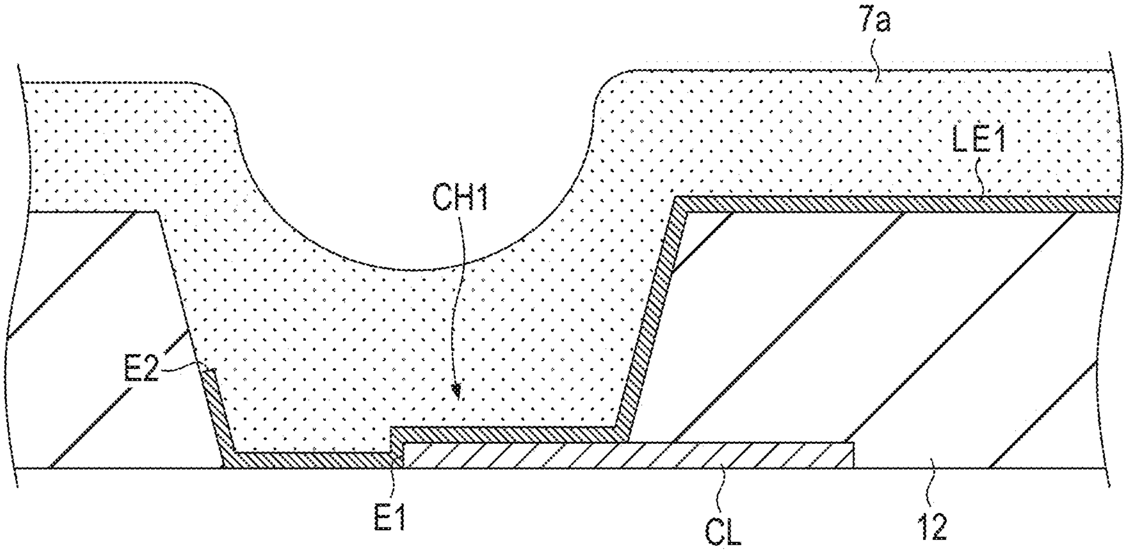
FIG. 7 is a schematic cross-sectional view showing a process following FIG. 6.

To form the filling material 7, first, as shown in FIG. 7, an insulating positive photosensitive material 7*a* is applied to (formed in) at least the entire display area DA. The photosensitive material 7*a* covers the insulating layer 12 and each of the lower electrodes LE1, LE2 and LE3 and fills at least part of the inside of each of the contact holes CH1, CH2 and CH3.

The photosensitive material 7*a* is formed so as to have substantially a uniform thickness in the flat area outside each of the contact holes CH1, CH2 and CH3. To the contrary, the photosensitive material 7*a* is easily stored inside the contact holes CH1, CH2 and CH3. Thus, of the photosensitive material 7*a*, the portion located inside the contact holes CH1, CH2 and CH3 is thicker than the other portions.

Figure 8:
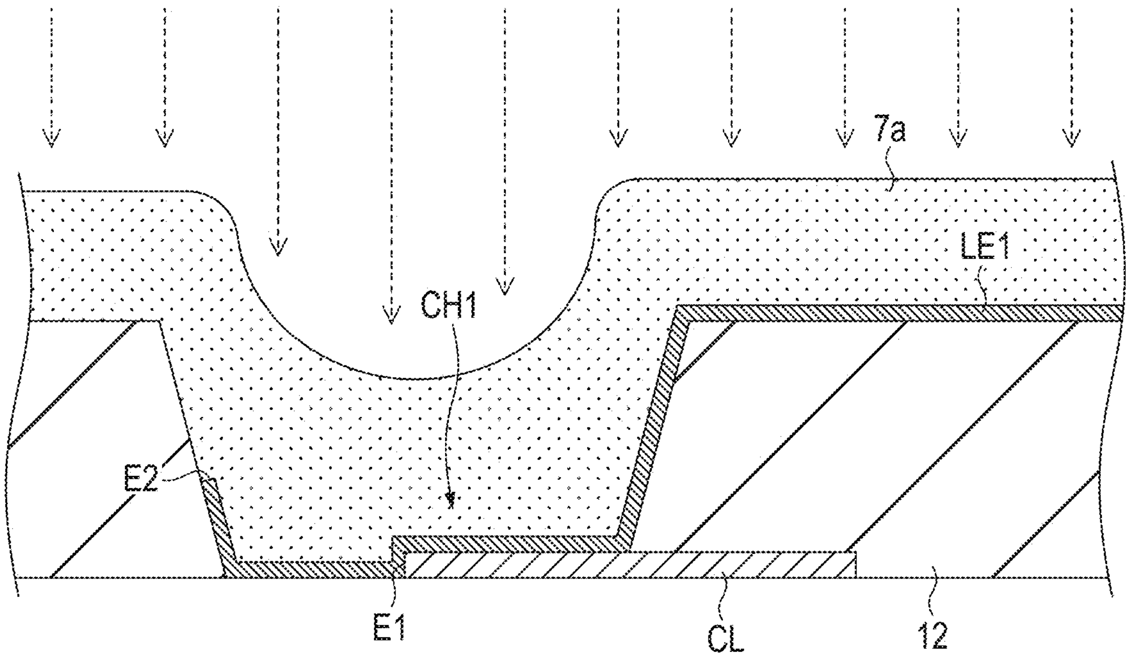
FIG. 8 is a schematic cross-sectional view showing a process following FIG. 7.

Subsequently, as shown in FIG. 8, the entire photosensitive material 7*a* is exposed (exposure process). This exposure is performed without using a photomask. In other words, the entire photosensitive material 7*a* is exposed with a uniform exposure amount.

Figure 9:
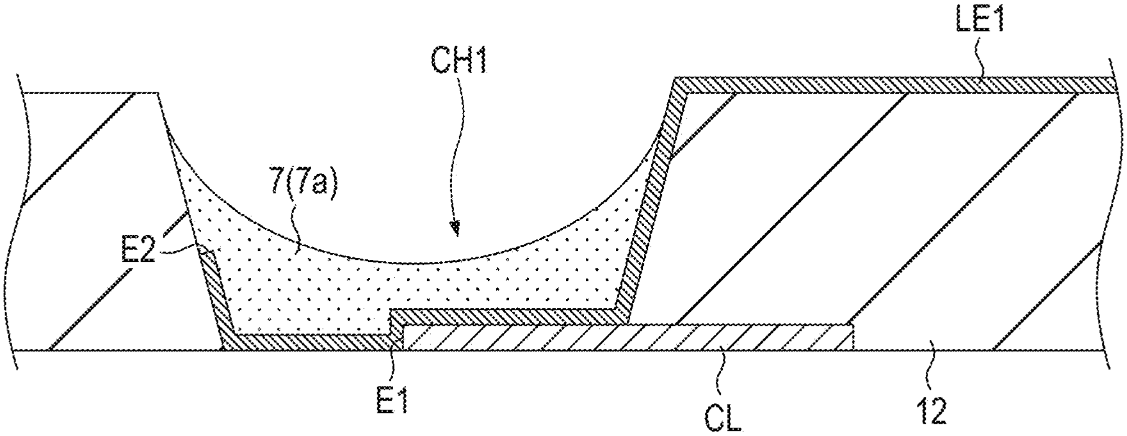
FIG. 9 is a schematic cross-sectional view showing a process following FIG. 8.

After the exposure process, the photosensitive material 7*a* is developed by a developer (development process). By this process, as shown in FIG. 9, of the photosensitive material 7*a*, the portion located outside each of the contact holes CH1, CH2 and CH3 is removed. Of the photosensitive material 7*a*, the portion located inside each of the contact holes CH1, CH2 and CH3 is not completely removed although the thickness is reduced. The photosensitive material 7*a* which remains inside each of the contact holes CH1, CH2 and CH3 forms the filling material 7 having the shape shown in FIG. 4.

To leave the photosensitive material 7*a* inside the contact holes CH1, CH2 and CH3 in the above manner, the exposure amount in the exposure process is set so as to completely remove, of the photosensitive material 7*a*, the portion located outside the contact holes CH1, CH2 and CH3 in the development process and so as not to completely remove, of the photosensitive material 7*a*, the portion located inside the contact holes CH1, CH2 and CH3 in the development process. In a case where the photosensitive material 7*a* is thick inside the contact holes CH1, CH2 and CH3 as shown in FIG. 8, even if uniform exposure is performed without using a photomask, an area in which exposure is insufficient can be easily formed inside the contact holes CH1, CH2 and CH3.

Figure 10:
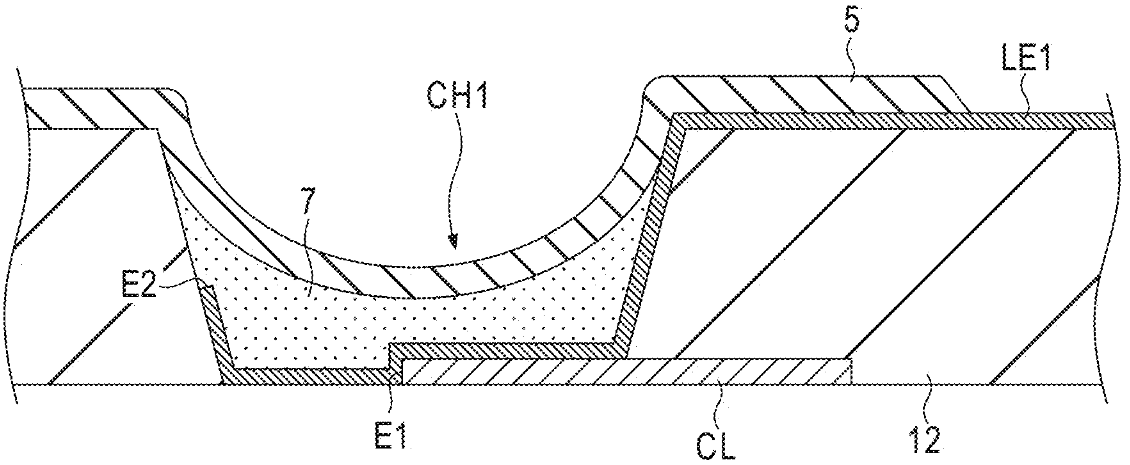
FIG. 10 is a schematic cross-sectional view showing a process following FIG. 9.
Figure 11:
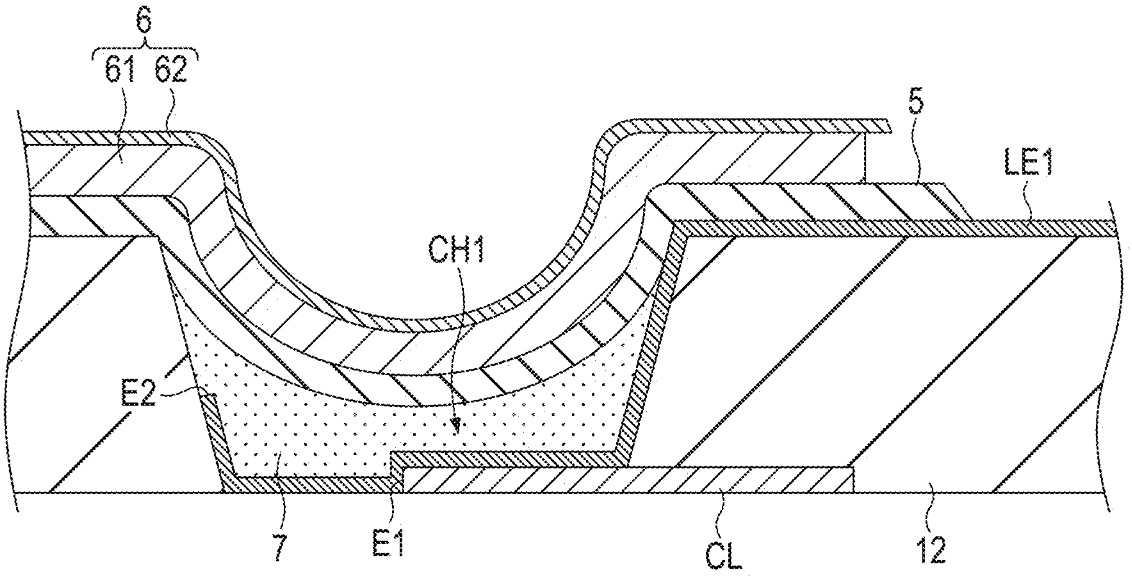
FIG. 11 is a schematic cross-sectional view showing a process following FIG. 10.

After process PR3, as shown in FIG. 10, the rib 5 which covers the insulating layer 12, the lower electrodes LE1, LE2 and LE3 and the filling material 7 is formed (process PR4). Further, as shown in FIG. 11, the partition 6 is formed on the rib 5 (process PR5). The pixel apertures AP1, AP2 and AP3 of the rib 5 may be formed before process PR5 or may be formed after process PR5.

After process PR5, a process for forming the display elements DE1, DE2 and DE3 is performed. In the present embodiment, this specification assumes a case where the display element DE1 is formed firstly, and the display element DE2 is formed secondly, and the display element DE3 is formed lastly. It should be noted that the formation order of the display elements DE1, DE2 and DE3 is not limited to this example.

Figure 12:
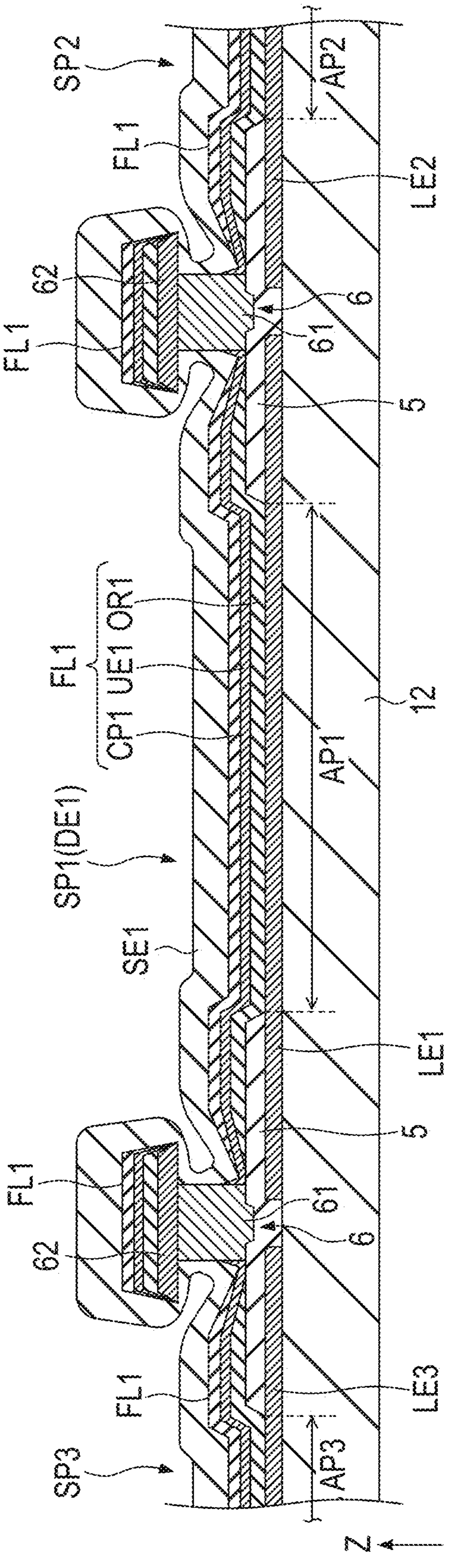
FIG. 12 is a schematic cross-sectional view showing a process following FIG. 11.

To form the display element DE1, first, as shown in FIG. 12, the organic layer OR1 which is in contact with the lower electrode LE1 through the pixel aperture AP1, the upper electrode UE1 which covers the organic layer OR1 and is in contact with the side surface of the lower portion 61 and the cap layer CP1 which covers the upper electrode UE1 are formed in order by vapor deposition, and further, the sealing layer SE1 which continuously covers the cap layer CP1 and the partition 6 is formed by chemical vapor deposition (CVD) (process PR6).

The thin film FL1 including the organic layer OR1, the upper electrode UE1 and the cap layer CP1 is formed in at least the entire display area DA, is provided in subpixels SP2 and SP3 as well as subpixel SP1 and is also provided on the partition 6. The thin film FL1 is divided by the partition 6 having an overhang shape. The sealing layer SE1 is formed in the entire display area DA and continuously covers the thin film FL1 without being divided by the partition 6.

Figure 13:
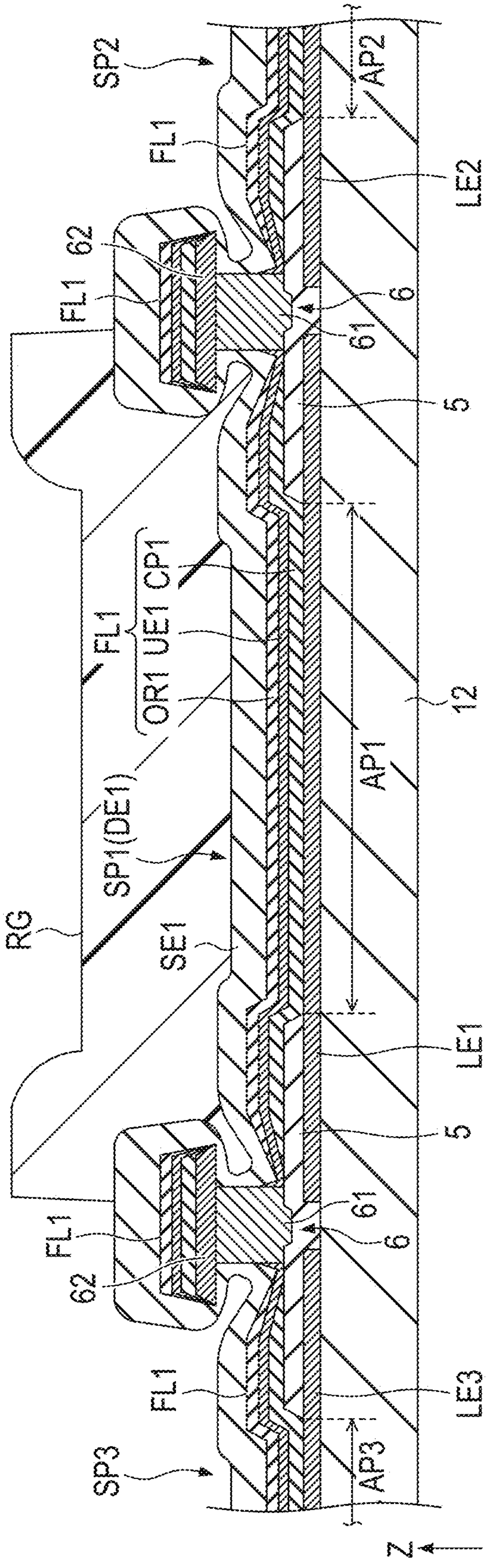
FIG. 13 is a schematic cross-sectional view showing a process following FIG. 12.

After process PR6, the thin film FL1 and the sealing layer SE1 are patterned (process PR7). In this patterning, as shown in FIG. 13, a resist RG is provided on the sealing layer SE1. The resist RG covers subpixel SP1 and part of the partition 6 around the subpixel.

Figure 14:
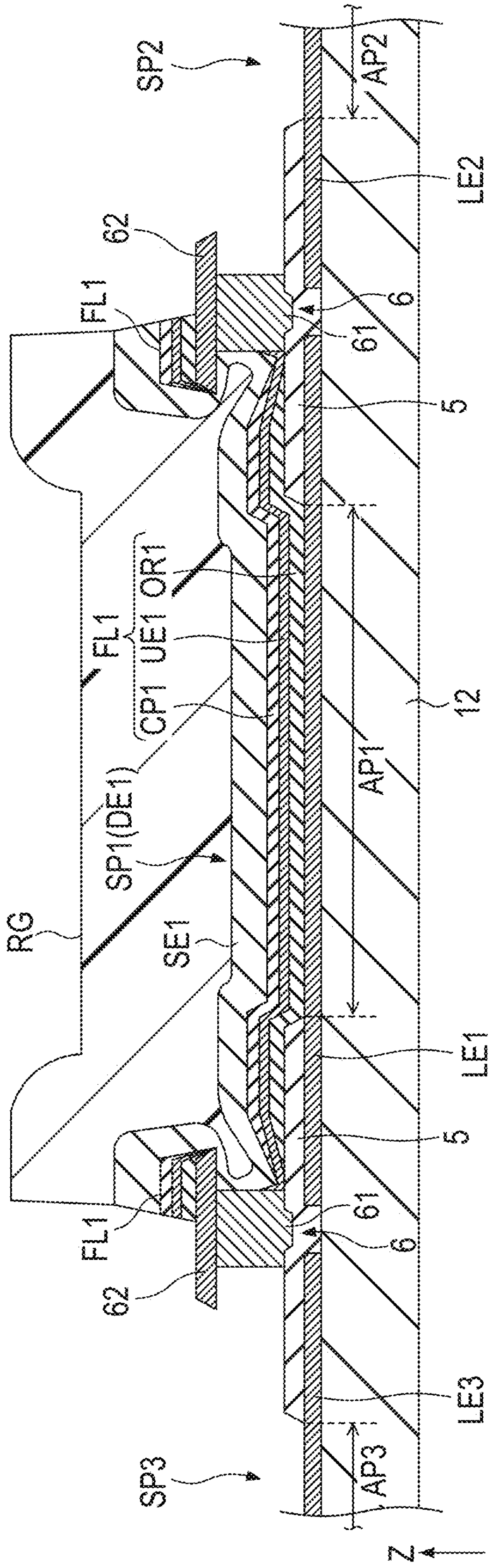
FIG. 14 is a schematic cross-sectional view showing a process following FIG. 13.

Subsequently, as shown in FIG. 14, of the thin film FL1 and the sealing layer SE1, the portions exposed from the resist RG are removed by etching using the resist RG as a mask. For example, this etching includes wet etching and dry etching processes which are performed in order for the sealing layer SE1, the cap layer CP1, the upper electrode UE1 and the organic layer OR1.

Figure 15:
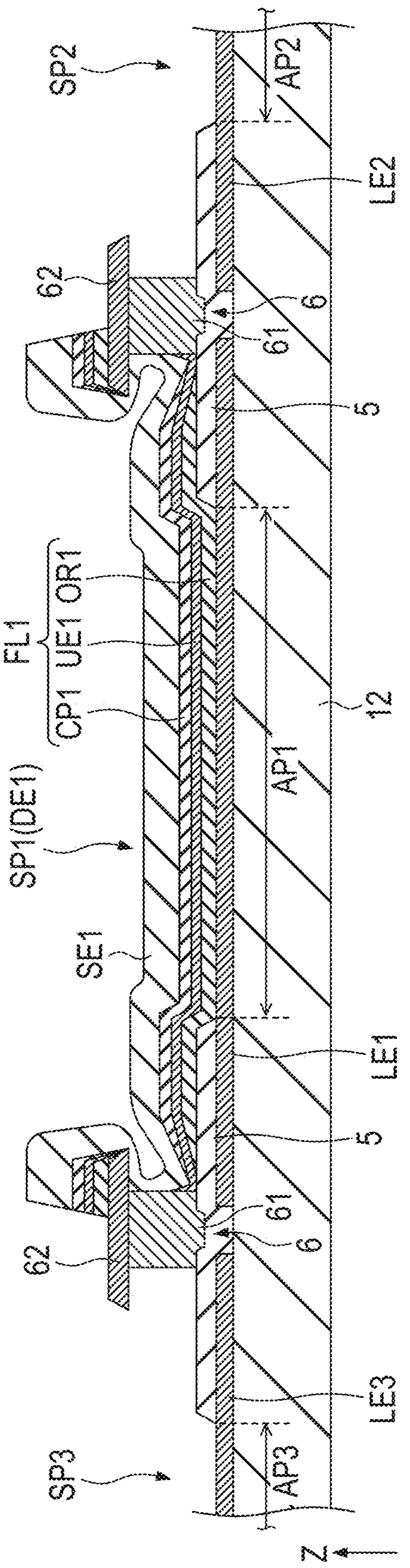
FIG. 15 is a schematic cross-sectional view showing a process following FIG. 14.

After the process shown in FIG. 14, the resist RG is removed. This process allows the acquisition of the following substrate. As shown in FIG. 15, in the substrate, the display element DE1 and the sealing layer SE1 are formed in subpixel SP1, and neither a display element nor a sealing layer is formed in subpixel SP2 or subpixel SP3.

The display element DE2 is formed by a procedure similar to that of the display element DE1. Specifically, after process PR7, the organic layer OR2 which is in contact with the lower electrode LE2 through the pixel aperture AP2, the upper electrode UE2 which covers the organic layer OR2 and the cap layer CP2 which covers the upper electrode UE2 are formed in order by vapor deposition, and further, the sealing layer SE2 which continuously covers the cap layer CP2 and the partition 6 is formed by CVD (process PR8).

The thin film FL2 including the organic layer OR2, the upper electrode UE2 and the cap layer CP2 is formed in at least the entire display area DA, is provided in subpixels SP1 and SP3 as well as subpixel SP2 and is also provided on the partition 6. The thin film FL2 is divided by the partition 6 having an overhang shape. The sealing layer SE2 is formed in the entire display area DA and continuously covers the thin film FL2 without being divided by the partition 6.

After process PR8, the thin film FL2 and the sealing layer SE2 are patterned by wet etching and dry etching (process PR9). The flow of this patterning is similar to that of process PR7.

Figure 16:
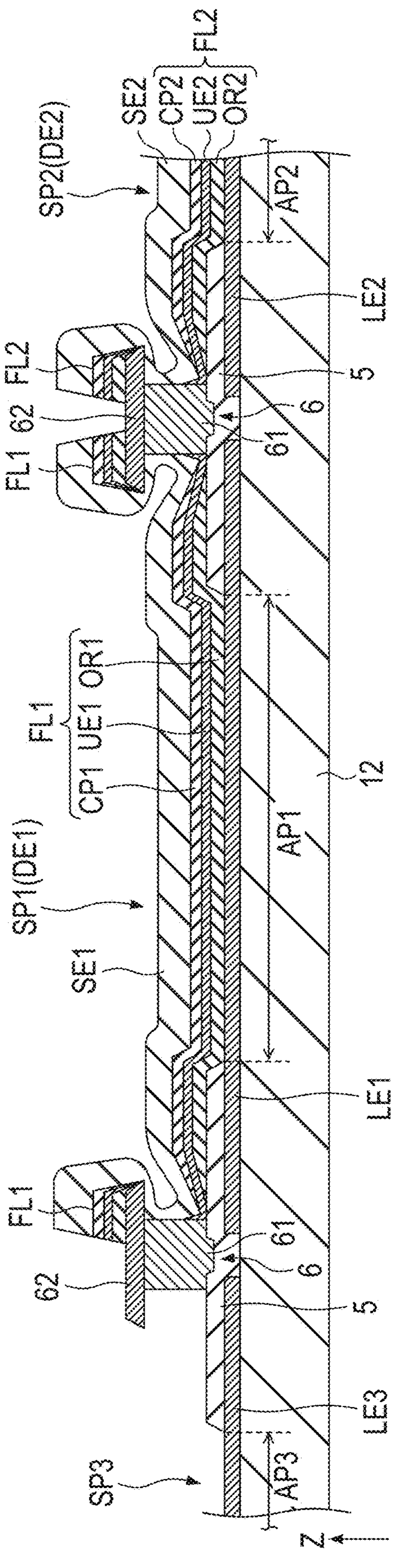
FIG. 16 is a schematic cross-sectional view showing a process following FIG. 15.

Process PR9 allows the acquisition of the following substrate. As shown in FIG. 16, in the substrate, the display element DE1 and the sealing layer SE1 are formed in subpixel SP1, and the display element DE2 and the sealing layer SE2 are formed in subpixel SP2, and neither a display element nor a sealing layer is formed in subpixel SP3.

The display element DE3 is formed by a procedure similar to the procedures of the display elements DE1 and DE2. Specifically, after process PR9, the organic layer OR3 which is in contact with the lower electrode LE3 through the pixel aperture AP3, the upper electrode UE3 which covers the organic layer OR3 and the cap layer CP3 which covers the upper electrode UE3 are formed in order by vapor deposition, and further, the sealing layer SE3 which continuously covers the cap layer CP3 and the partition 6 is formed by CVD (process PR10).

The thin film FL3 including the organic layer OR3, the upper electrode UE3 and the cap layer CP3 is formed in at least the entire display area DA, is provided in subpixels SP1 and SP2 as well as subpixel SP3 and is also provided on the partition 6. The thin film FL3 is divided by the partition 6 having an overhang shape. The sealing layer SE3 is formed in the entire display area DA and continuously covers the thin film FL3 without being divided by the partition 6.

After process PR10, the thin film FL3 and the sealing layer SE3 are patterned by wet etching and dry etching (process PR11). The flow of this patterning is similar to that of process PR7.

Figure 17:
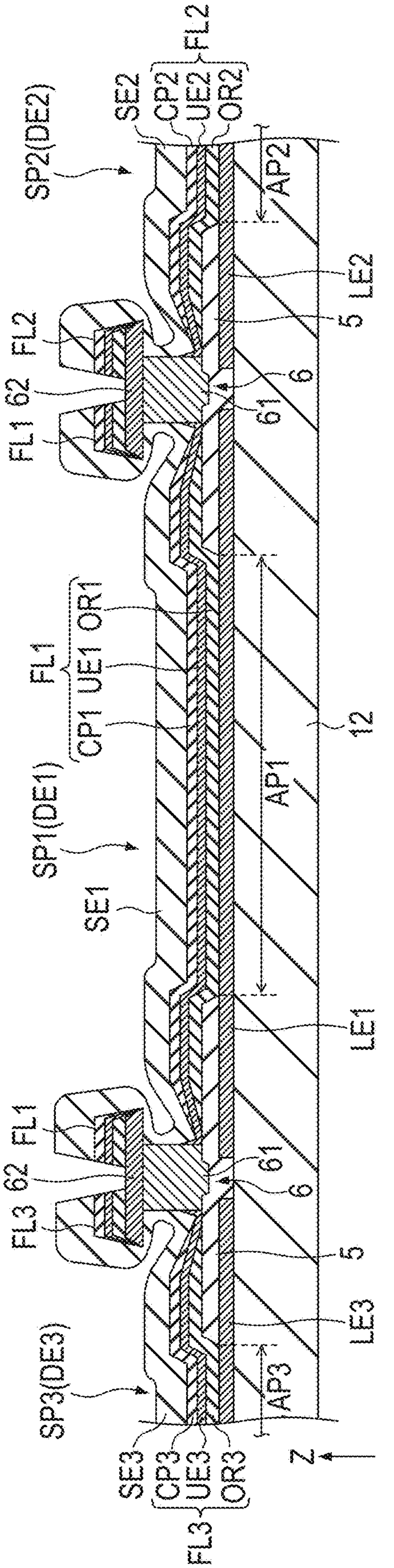
FIG. 17 is a schematic cross-sectional view showing a process following FIG. 16.

Process PR11 allows the acquisition of the following substrate. As shown in FIG. 17, in the substrate, the display element DE1 and the sealing layer SE1 are formed in subpixel SP1, and the display element DE2 and the sealing layer SE2 are formed in subpixel SP2, and the display element DE3 and the sealing layer SE3 are formed in subpixel SP3.

After the display elements DE1, DE2 and DE3 and the sealing layers SE1, SE2 and SE3 are formed, the resin layer 13, sealing layer 14 and resin layer 15 shown in FIG. 3 are formed in order (process PR12). By this process, the display device DSP is completed.

Examples of the effects obtained from the present embodiment are explained below.

Figure 18:
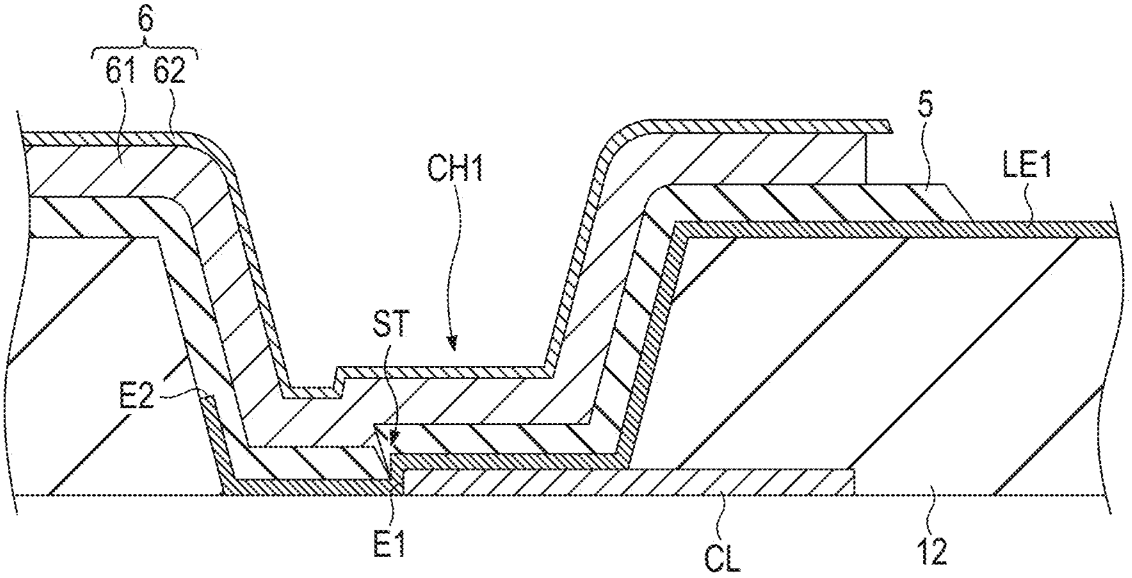
FIG. 18 is a schematic cross-sectional view showing a comparative example of the embodiment.

FIG. 18 is a schematic cross-sectional view showing a comparative example of the embodiment and shows the structure of the contact hole CH1 and its vicinity in a manner similar to that of FIG. 4. In this comparative example, the filling material 7 is not provided in the contact hole CH1. Thus, the lower electrode LE1 is covered with the rib 5 inside the contact hole CH1.

In this comparative example, in a manner similar to that of the example of FIG. 4, the step portion ST is formed in the lower electrode LE1 because of the end portion E1 of the conductive layer CL. Because of this step portion ST, a defective portion such as a seam which does not sufficiently cover the lower electrode LE1 could be generated. In this case, there is a possibility that the lower portion 61 of the partition 6 provided on the rib 5 is short-circuited with the lower electrode LE1 through the defective portion.

In the present embodiment, the filling material 7 is provided inside each of the contact holes CH1, CH2 and CH3. As the filling material 7 is interposed between each of the lower electrodes LE1, LE2 and LE3 and the rib 5, the rib 5 is not easily affected by the step portion ST. This configuration prevents the generation of the defective portion of the rib 5 like the comparative example and the short circuit caused by the defective portion between the lower electrodes LE1, LE2 and LE3 and the lower portion 61.

Further, in the embodiment, the thickness of the filling material 7 is less than depths D of the contact holes CH1, CH2 and CH3. If the filling material 7 is thicker than depths D of the contact holes CH1, CH2 and CH3, a shape failure such as a rise in the rib 5 or partition 6 covering the filling material 7 at the positions of the contact holes CH1, CH2 and CH3 could occur. However, in the embodiment, as the filling material 7 does not exceed the contact hole CH1, CH2 or CH3, the effect caused to the rib 5 and the partition 6 by the provision of the filling material 7 is suppressed.

As a method for preventing the short circuit described above, the generation of the step portion ST could be prevented by providing the end portion E1 of the conductive layer CL so as not to be located inside the contact hole CH1, CH2 or CH3. However, for example, in high-definition display devices, as the space for providing each element is restricted, the end portion E1 of the conductive layer CL is forced to be in the contact holes CH1, CH2 and CH3 in some cases. Moreover, even in design in which the end portion E1 is not located in the contact hole CH1, CH2 or CH3, there is a possibility that the end portion E1 gets into the contact holes CH1, CH2 and CH3 because of a manufacturing error. Even in any of these cases, if the filling material 7 is provided like the embodiment, the short circuit described above can be prevented. As a result, the yield of the manufacturing process of the display device can be improved.

The filling material 7 can be formed by the method explained with reference to FIG. 6 to FIG. 9. In this method, there is no need to use a photomask at the time of the exposure of the photosensitive material 7*a* which is the base of the filling material 7. Therefore, the manufacturing process can be simplified.

If a photomask is used, an area in which the photosensitive material 7*a* is not exposed by the photomask could be generated near the contact holes CH1, CH2 and CH3. In this case, the filling material 7 is unnecessarily formed outside the contact holes CH1, CH2 and CH3. If a shape failure occurs in the rib 5 or the partition 6 by this filling material 7, the yield is reduced. However, when the method explained with reference to FIG. 6 to FIG. 9 is used, the filling material 7 is not formed outside the contact hole CH1, CH2 or CH3. By this configuration, the yield of the manufacturing process can be further improved.

All of the display devices and manufacturing methods thereof that can be implemented by a person of ordinary skill in the art through arbitrary design changes to the display device and manufacturing method thereof described above as the embodiments of the present invention come within the scope of the present invention as long as they are in keeping with the spirit of the present invention.

Various modification examples which may be conceived by a person of ordinary skill in the art in the scope of the idea of the present invention will also fall within the scope of the invention. For example, even if a person of ordinary skill in the art arbitrarily modifies the above embodiments by adding or deleting a structural element or changing the design of a structural element, or adding or omitting a step or changing the condition of a step, all of the modifications fall within the scope of the present invention as long as they are in keeping with the spirit of the invention.

Further, other effects which may be obtained from each embodiment and are self-explanatory from the descriptions of the specification or can be arbitrarily conceived by a person of ordinary skill in the art are considered as the effects of the present invention as a matter of course.

What is claimed is:

1. A display device comprising:
a circuit layer including a pixel circuit;
an insulating layer which covers the circuit layer and comprises a contact hole;
a lower electrode provided above the insulating layer and connected to the pixel circuit through the contact hole;
a filling material located inside the contact hole and formed of an organic insulating material which covers the lower electrode;
a rib comprising a pixel aperture which overlaps the lower electrode;
a partition provided above the rib;
an organic layer which covers the lower electrode through the pixel aperture and emits light based on application of voltage; and
an upper electrode which covers the organic layer, wherein
the rib and the partition overlap an entire of the contact hole as seen in plan view,
a thickness of the filling material is less than a depth of the contact hole, and
an upper surface of the filling material has a shape which is depressed toward a lower side.

2. The display device of claim 1, wherein
the filling material has a shape in which the thickness decreases toward a center of the contact hole.

3. The display device of claim 1, wherein
the pixel circuit includes a conductive layer exposed from the insulating layer through the contact hole, and
the lower electrode is in contact with the conductive layer inside the contact hole.

4. The display device of claim 3, wherein
the conductive layer comprises an end portion located inside the contact hole,
the lower electrode comprises a step portion generated by the end portion of the conductive layer, and
the filling material covers the step portion.

5. The display device of claim 4, wherein
the thickness of a portion of the filling material located above the step portion is greater than or equal to a thickness of the conductive layer.

6. The display device of claim 4, wherein
a position of the end portion of the conductive layer is not coincident with a center of the contact hole.

7. The display device of claim 6, wherein
a position of the step portion is not coincident with the center of the contact hole.

8. The display device of claim 1, wherein
the lower electrode comprises an end portion located inside the contact hole, and
the filling material covers the end portion of the lower electrode.

9. The display device of claim 8, wherein
the end portion of the lower electrode is located on an inner surface of the contact hole.

10. The display device of claim 1, wherein
each of the rib and the partition comprises a recess portion which is depressed toward inside of the contact hole.

11. The display device of claim 1, wherein
the partition includes a conductive lower portion and an upper portion provided on the lower portion and protruding from a side surface of the lower portion.

12. The display device of claim 11, wherein
a thin film including the organic layer and the upper electrode is divided by the partition.

13. The display device of claim 12, further comprising
a sealing layer formed of an inorganic insulating material and continuously covering a plurality of portions of the thin film divided by the partition.

14. The display device of claim 13, wherein
neither the thin film nor the sealing layer is provided above the contact hole.

15. A manufacturing method of a display device, comprising:
forming a circuit layer including a pixel circuit;
forming an insulating layer which covers the circuit layer and comprises a contact hole;
forming a lower electrode connected to the pixel circuit through the contact hole above the insulating layer;
forming an insulating photosensitive material which covers the insulating layer and the lower electrode and fills at least part of the contact hole;
exposing an entire of the photosensitive material without using a photomask; and
forming a filling material having a thickness less than a depth of the contact hole inside the contact hole by developing the photosensitive material to remove a portion of the photosensitive material located outside the contact hole, and by reducing a thickness of a portion of the photosensitive material located inside the contact hole.

16. The manufacturing method of claim 15, wherein
the pixel circuit includes a conductive layer covered with the insulating layer,
the contact hole is formed such that the conductive layer is exposed from the insulating layer, and
the lower electrode is in contact with the conductive layer inside the contact hole.

17. The manufacturing method of claim 16, wherein
the conductive layer comprises an end portion located inside the contact hole,
the lower electrode comprises a step portion generated by the end portion of the conductive layer, and
the filling material is formed so as to cover the step portion.

18. The manufacturing method of claim 15, further comprising:
forming a rib which covers the filling material and comprises a pixel aperture overlapping the lower electrode; and
forming a partition provided above the rib.

19. The manufacturing method of claim 18, further comprising:
forming an organic layer which covers the lower electrode through the pixel aperture and emits light based on application of voltage; and
forming an upper electrode which covers the organic layer and is in contact with the partition.

20. A display device comprising:
a circuit layer including a pixel circuit;
an insulating layer which covers the circuit layer and comprises a contact hole;
a lower electrode provided above the insulating layer and connected to the pixel circuit through the contact hole;
a filling material located inside the contact hole and formed of an organic insulating material which covers the lower electrode;
a rib formed of an inorganic insulating material and comprising a pixel aperture which overlaps the lower electrode;

a partition provided above the rib;

an organic layer which covers the lower electrode through the pixel aperture and emits light based on application of voltage; and an upper electrode which covers the organic layer, wherein the rib and the partition overlap an entire of the contact hole as seen in plan view, and a thickness of the filling material is less than a depth of the contact hole.

* * * * *